(12) United States Patent
Broad

(10) Patent No.: US 7,554,299 B2
(45) Date of Patent: Jun. 30, 2009

(54) BATTERY MONITORING CIRCUIT AND METHOD

(75) Inventor: Alan S. Broad, Palo Alto, CA (US)

(73) Assignee: Crossbow Technology, Inc., San Jose, CA (US)

( * ) Notice: Subject to any disclaimer, the term of this patent is extended or adjusted under 35 U.S.C. 154(b) by 869 days.

(21) Appl. No.: 11/095,290

(22) Filed: Mar. 30, 2005

(65) Prior Publication Data

US 2006/0226844 A1   Oct. 12, 2006

(51) Int. Cl.
*H02J 7/04* (2006.01)
*H02J 7/06* (2006.01)

(52) U.S. Cl. .................................. 320/149; 320/159

(58) Field of Classification Search ............. 320/155, 320/158, 159, 149; 330/258
See application file for complete search history.

(56) References Cited

U.S. PATENT DOCUMENTS

| 4,820,966 | A  | * | 4/1989  | Fridman ...................... 320/116 |
| 5,451,881 | A  | * | 9/1995  | Finger ......................... 324/433 |
| 6,812,674 | B2 | * | 11/2004 | Hoffman ..................... 320/162 |
| 6,856,922 | B1 | * | 2/2005  | Austin et al. .................. 702/63 |
| 6,985,037 | B2 | * | 1/2006  | Veal ........................... 330/258 |

* cited by examiner

*Primary Examiner*—Jessica Han
*Assistant Examiner*—Emily Pham
(74) *Attorney, Agent, or Firm*—Fenwick & West LLP

(57) ABSTRACT

A battery-monitoring circuit detects rapid changes in current drawn from a battery by a device powered thereby. The circuit includes calibrating operating modes that determine voltage-to-frequency conversion parameters, and amplifier errors at various levels of battery voltage.

10 Claims, 1 Drawing Sheet

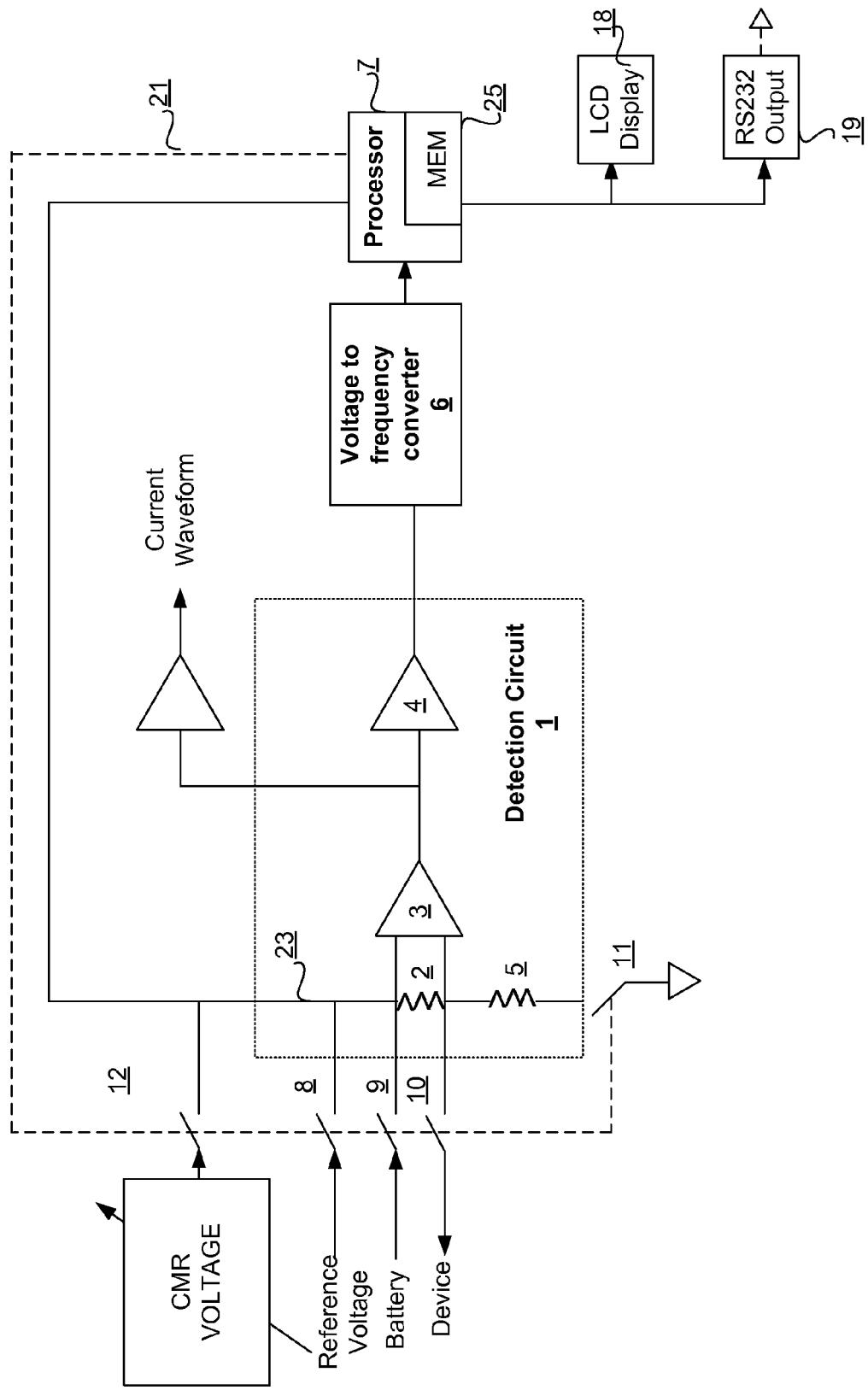

US 7,554,299 B2

BATTERY MONITORING CIRCUIT AND METHOD

FIELD OF THE INVENTION

This invention relates generally to circuitry and a method for measuring battery capacity by integrating current drawn over time.

BACKGROUND OF THE INVENTION

Battery capacity is rated in terms of power, specified in units of amp-hours (A-h), as a measure for a battery to deliver x Amps for y hours. To measure the duration of time a device will operate with a specified battery requires measuring the instantaneous currents (Amps) drawn by the device accumulated over time (hours) until the battery is fully discharged.

Commercial integrated circuits exist to monitor battery capacity in cellular phones and other handheld devices. However, these circuits only perform well with devices that draw a fairly constant, slow-changing current from the battery. Such circuits typically fail to give accurate information for devices that rapidly change current consumption over a large range of current. Furthermore, conventional monitoring circuits typically do not maintain accurate calibrations.

Processors that change current consumption over time and across several orders of magnitude now control many devices. In such devices, conventional battery monitoring circuits become inadequate. For example, a conventional battery-monitoring circuit may be specified as having the following operating parameters:

$G_{vf}$=32.55 $H_z$/volt (voltage to frequency gain);
$V_{sense}$=100 millivolts (maximum sense voltage);
f=$G_{vf} \times V_{sense}$=3.255 $H_z$ (maximum v-f frequency);

where $V_{sense}$=is the voltage across a known value of resistance conducting an input current. Currents that change more rapidly than 3.255 $H_z$ are not accurately tracked. Since many integrated circuits can turn on in sub-millisecond time intervals, a very fast voltage-to-frequency converter is required to operate at, say, 100,000 times faster than such conventional battery-monitoring circuits.

Also, such conventional circuits are typically not capable of accurately tracking large changes in the current being monitored. For a 1-ohm sensing resistor conducting about 100 milliamps, the allowable sense voltage attains the maximum value of 100 millivolts and a representative output frequency of 3.255 $H_z$. However, if the input current decreases to 100 microamps, then the output frequency reduces to 0.003255 $H_z$ which has a periodicity of over 300 seconds that is difficult to measure without complex circuitry.

SUMMARY OF THE INVENTION

In accordance with the present invention, battery capacity monitoring is accomplished with accuracy over dynamic current changes in time. A detection circuit measures the current drawn by a device from a battery, and a voltage-to-frequency converter generates a frequency proportional to this current. A processor then accumulates a count of this frequency to create an integral of current over time drawn by the device from the battery. This output is representative of a portion of battery capacity delivered and measured in amp-hours (or milliamp-hours). The processor also calibrates a transform factor of the detection circuit and voltage-to-frequency converter in response to a reference voltage applied to a reference resistor. This transform factor facilitates accurate calibration of the transform of input current to accumulated count associated with remaining battery life.

Battery monitoring in accordance with the present invention involves integration of current over time. A frequency proportional to a value representing current drawn by a device from a specified battery is converted into an integral of current over time drawn from the battery. This conversion involves accumulating a count over time of the various frequencies associated with different load currents over time.

DESCRIPTION OF THE DRAWING

The figure is a block schematic diagram of an embodiment of the present invention.

DETAILED DESCRIPTION OF THE DRAWING

The block diagram illustrates the components of a detection circuit for monitoring battery capacity in accordance to an embodiment of the present invention. Detection circuit 1 is connected between a battery (not shown) and a device powered thereby (not shown) and includes a resistor 2 connected between the battery and the device, with a differential amplifier 3 connected across the resistor and cascaded with an amplifier 4.

In the detection circuit, current flows from the battery through the resistor 2 to the powered device. The resistor 2 is selected to have very low resistance (0.1 ohm) so that it does not affect operation of the powered device. The differential amplifier 3 connected to the terminals of the resistor 2 receives and amplifies the voltage across the resistor 2. The amplifier 4 receives and further amplifies the output voltage from the differential amplifier 3. The amplifier 4 produces an output value representative of and proportional to instantaneous current drawn by the powered device from the battery.

In order for the battery monitoring circuit to accurately measure dynamic current changes over time, the differential amplifier 3 and amplifier 4 exhibit rapid responses to fast current transients generated by the device (typically to final settled value within less than 10 microseconds). Further, the total gain of the two cascaded amplifiers may be approximately 1000 so that the battery monitoring circuit can monitor battery currents at a level down to about 10 microamps.

The output of the detection circuit is supplied to voltage-to-frequency converter (V-F) 6 that generates an output frequency proportional to the received output from amplifier 4. The converter responds rapidly to voltage transients and operates over a dynamic frequency range of about 10,000 to accommodate dynamic current changes. Suitable devices are commercially available, such as Model No. VFC110 from Texas Instruments, Inc. of Dallas, Tex.

Processor 7 receives the output frequency from V-F converter 6 and an internal counter increments an accumulating count on each pulse of the frequency. This count represented the integral of current over time drawn from the battery by the powered device.

The battery monitoring circuit includes self-calibration features to maintain its precision. A reference or calibrating precision resistor 5 is connected in series with the resistor 2, and a switching circuit selectively switches various inputs to the circuit. Specifically, in battery-monitoring mode, switches 9 and 10 are connected, while switches 8 and 11 are disconnected so that differential amplifier 3 is connected to receive the voltage-across resistor 2 that results from current flowing from the battery to the powered device. In one self-calibration mode, switches 9 and 10 are disconnected while switches 8 and 11 are connected so that the differential amplifier 3 is connected to receive the voltage across resistor 2 resulting from a calibrated current flowing from the reference voltage through the series resistors 2, 5. During this self-calibration, the processor 7 calibrates a transform factor of the detection circuit 1 as a proportionality of output frequency from voltage-to-frequency converter 6 in response to the reference voltage applied to the series connection of resistor 2 and reference resistor 5. In another self-calibration mode, the common-mode rejection parameter of the differential amplifier 3 is analyzed over the entire operating input range of the differential amplifier 3. An operational amplifier such as the high speed differential amplifier 3 are specified by CMRR (Common Mode Rejection Ratio) which is a measure of how the amplifier output changes if the two differential inputs are connected together to receive a common input that varies in amplitude over the entire input range of the amplifier. The output of a perfect differential amplifier would not change over the operational range in such test. However, most conventional differential amplifiers have some CMRR specifications that represents error or conversion to an output that typically is not suitable for a high-precision current monitoring circuit.

In accordance with an embodiment of the present invention, a software calibration technique takes advantage of the fact that even though the input current may change rapidly, the actual input voltage remains very close to the battery voltage. The battery voltage can change over a large range (depending on the battery type), typically 14 volts for lead-acid batteries to 0.9 volts for alkaline batteries. However, since battery voltage changes slowly, and if the output offset of the amplifier is known for all battery voltages, then the CMRR error can be removed or calculated out during operation. This may be accomplished in a two-step process, including:

Measuring and storing the CMRR errors of the differential amplifier during calibration at various voltage levels; and Removing the CMRR error at each voltage level during battery-powered operations.

Thus, during a periodic calibration under control 21 of processor 7 with switches 8-11 open (i.e., no current flowing and no voltage drops across resistor 2), a voltage 12 (CMR) is commonly applied to both inputs of the differential amplifier at varied levels over the operational range of battery voltages. The output of the differential amplifier (due to common-mode conversion) at each level of applied voltage 23 is measured and recorded or stored in a memory 25, for example, within the processor 7 as a signal representative of an error voltage. A calibration look-up table is constructed of input voltages vs. output error voltages. Then, during monitoring mode of operation, the processor 7 periodically measures the battery voltage, performs a look-up operation in the calibration look-up table with the measured battery voltage as a storage address, and logically combines the output of the v-to-f converter 6 with the stored error signal to remove the associated error from the output of the v-to-f converter 6.

The battery monitoring circuit of the present invention also contains system diagnostic features. For example, the battery being monitored is connected to an analog-to-digital input channel of the processor 7 so the processor can monitor and accumulate digital values representative of the battery voltage over time for storage and later analysis. Also, the output of the differential amplifier 3 is a signal that represents the instantaneous current drawn from the battery. This signal may be connected to an external oscilloscope to view the dynamic current load of the powered device. In addition, the output of the circuit operating in battery-monitoring mode is the integral over time of current drawn from the battery by the powered device in amp-hours (or, milliamp-hours), as previously described herein. This value may be displayed on a visual indicator such as an LCD display 18 and may also be supplied over a standard RS-232 serial data communication link to an external processor disposed to maintain a continual log of battery capacity and performance.

What is claimed is:

1. A circuit for monitoring current supplied by a battery, the circuit comprising:

a detector including a resistor connected between the battery and a device powered thereby, and including a differential amplifier having inputs connected to terminals of the resistor for providing an output representative of current drawn by the device from the battery, the detector further comprising:

a reference resistor selectively connectable to the resistor;

a reference voltage; and a switching circuit for selectively supplying the reference voltage to a series connection of the resistor and reference resistor for establishing a reference level of input to the differential amplifier;

a voltage-to-frequency converter coupled to receive the output from the detector for generating an output frequency proportional to the received output from the detector; and a processor coupled to receive the output frequency from the voltage-to-frequency converter for producing an output representative of an integral of current over time drawn from the battery.

2. A circuit including a differential amplifier having inverting and non-inverting inputs for operation over a selected range of applied voltages, the circuit comprising:

a source of voltage at various amplitudes;

circuitry for connecting the source of voltage to the inverting and non-inverting inputs of the differential amplifier for supplying thereto a plurality of different voltages within the selected range;

a converter for converting an applied voltage to a corresponding frequency, the converter being connected to an output of the differential amplifier for producing output signals indicative of common-mode rejection error of the differential amplifier at each of the plurality of different voltages;

a memory communicating with the converter for storing frequency values representative of common-mode rejection errors at storage locations having addresses indicative of the corresponding plurality of different voltages within the selected range; and a processor communicating with the memory and with the converter for producing an output representative of a correction by an amount of an error signal stored in the memory at an address location corresponding to a voltage at an input of the differential amplifier within the selected range, the processor controlling the circuitry for connecting the source of voltage to the differential amplifier or for connecting other voltages within the selected range to the inputs of the differential amplifier.

3. A circuit for monitoring current supplied by a battery, the circuit comprising:

a detector including a resistor connected between the battery and a device powered thereby, and including a differential amplifier having inputs connected to terminals of the resistor for providing an output representative of current drawn by the device from the battery, the detector also including a reference resistor selectively connectible to the resistor;

a reference voltage;

a switching circuit for selectively supplying the reference voltage to a series connection of the resistor and reference resistor for establishing a reference level of input to the differential amplifier;

a voltage-to-frequency converter coupled to receive the output from the detector for generating an output frequency proportional to the received output from the detector; and a processor coupled to receive the output frequency from the voltage-to-frequency converter for producing an output representative of an integral of current over time drawn from the battery.

4. A method for operating an electronic circuit, including a differential amplifier having inverting and non-inverting inputs, the method comprising:
applying each of selected different voltages within a range of voltages to the inverting and non-inverting inputs of the differential amplifier to produce at an output thereof signals indicative of common-mode rejection errors at the corresponding selected applied voltages;
converting the error signals to associated frequency values;
storing the frequency values at memory locations having addresses indicative of the corresponding selected different voltages; and
retrieving a stored frequency value from a memory location at an address corresponding to a voltage applied to an input of the differential amplifier for logically combining with an output thereof to correct for common-mode rejection error of the differential amplifier.

5. A method for operating an electronic circuit, including a differential amplifier having inverting and non-inverting inputs, the method comprising:
applying each of selected different voltages within a range of voltages to the inverting and non-inverting inputs of the differential amplifier to produce at an output thereof signals indicative of common-mode rejection errors at the corresponding selected applied voltages;
converting the error signals to associated frequency values;
storing the frequency values at memory locations having addresses indicative of the corresponding selected different voltages; and
combining errors in converting error signals to associated frequency values with the errors indicative of common-mode rejection errors for storage at the memory locations having addresses indicative of the corresponding selected different voltages.

6. A circuit for monitoring current supplied by a battery, the circuit comprising:
a detector including a resistor connected between the battery and a device powered thereby, and including a differential amplifier having inputs connected to terminals of the resistor for providing an output representative of current drawn by the device from the battery, the detector also including a reference resistor selectively connectible to the resistor;
a reference voltage;
a switching circuit for selectively supplying the reference voltage to a series connection of the resistor and reference resistor for establishing a reference level of input to the differential amplifier, the switching circuit switching the resistor between the battery and the device in one mode, and applying the reference voltage to a series connection of the resistor and the reference resistor in another mode;
a voltage-to-frequency converter coupled to receive the output from the detector for generating an output frequency proportional to the received output from the detector; and
a processor coupled to receive the output frequency from the voltage-to-frequency converter for producing an output representative of an integral of current over time drawn from the battery.

7. A circuit for monitoring current supplied by a battery, the circuit comprising:
a detector including a resistor connected between the battery and a device powered thereby, and including a differential amplifier having inputs connected to terminals of the resistor for providing an output representative of current drawn by the device from the battery, the detector also including a reference resistor selectively connectible to the resistor;
a reference voltage;
a switching circuit for selectively supplying the reference voltage to a series connection of the resistor and reference resistor for establishing a reference level of input to the differential amplifier;
a voltage-to-frequency converter coupled to receive the output from the detector for generating an output frequency proportional to the received output from the detector;
a processor coupled to receive the output frequency from the voltage-to-frequency converter and calibrate a transform factor relating the output frequency of the voltage-to-frequency converter to the applied reference voltage for producing an output representative of an integral of current over time drawn from the battery.

8. A circuit for monitoring current supplied by a battery, the circuit comprising:
a detector including a resistor connected between the battery and a device powered thereby, and including a differential amplifier having inputs connected to terminals of the resistor for providing an output representative of current drawn by the device from the battery, the detector also including a reference resistor selectively connectible to the resistor;
a reference voltage;
a source of voltage variable over a range of voltages substantially representative of an operating range of battery voltages;
a switching circuit for selectively supplying the reference voltage to a series connection of the resistor and reference resistor for establishing a reference level of input to the differential amplifier, the switching circuit operable in a mode for connecting the source of variable voltage substantially in common to the inputs of the differential amplifier;
a voltage-to-frequency converter coupled to receive the output from the detector for generating an output frequency proportional to the received output from the detector; and
a processor coupled to receive the output frequency from the voltage-to-frequency converter for producing an output representative of an integral of current over time drawn from the battery.

9. The circuit of claim 8 in which the processor accumulates a voltage-to-frequency output for each of selected voltages from the source of variable voltages as error values at such selected voltages.

10. The circuit of claim 9 in which the switching circuit operable in another mode connects the resistor between the battery and the device; and
the processor alters by the error values the voltage to frequency output as a calibrated representation of current drawn by the device from the battery.

* * * * *